US012622230B2

(12) United States Patent
Jiang et al.

(10) Patent No.: US 12,622,230 B2
(45) Date of Patent: May 5, 2026

(54) TEST STRUCTURE AND METHOD FOR FORMING THE SAME, AND SEMICONDUCTOR MEMORY

(71) Applicant: CHANGXIN MEMORY TECHNOLOGIES, INC., Hefei City (CN)

(72) Inventors: Yi Jiang, Hefei City (CN); Deyuan Xiao, Hefei City (CN); Qinghua Han, Hefei City (CN); Meng-Feng Tsai, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 694 days.

(21) Appl. No.: 17/935,572

(22) Filed: Sep. 26, 2022

(65) Prior Publication Data

US 2023/0021007 A1 Jan. 19, 2023

Related U.S. Application Data

(63) Continuation of application No. PCT/CN2022/109733, filed on Aug. 2, 2022.

(30) Foreign Application Priority Data

Jun. 23, 2022 (CN) .......................... 202210844886.2

(51) Int. Cl.
| | |
|---|---|
| *H01L 21/66* | (2006.01) |
| *G11C 16/14* | (2006.01) |
| *H01L 23/528* | (2006.01) |
| *H10P 74/00* | (2026.01) |

(52) U.S. Cl.
CPC .................................. *H10P 74/277* (2026.01)

(58) Field of Classification Search
CPC ............................. H01L 22/34; H01L 23/535
See application file for complete search history.

(56) References Cited

U.S. PATENT DOCUMENTS

| | | | |
|---|---|---|---|
| 8,179,155 B2 | 5/2012 | Tseng | |
| 10,679,723 B1 * | 6/2020 | Lee ........................ | H10B 43/40 |
| 2004/0069989 A1 | 4/2004 | Wu | |
| 2004/0082087 A1 | 4/2004 | Wu | |
| 2005/0184289 A1 | 8/2005 | Wu | |
| 2022/0392913 A1 * | 12/2022 | Lee ........................ | H10B 41/40 |

FOREIGN PATENT DOCUMENTS

| | | |
|---|---|---|
| CN | 101304020 A | 11/2008 |
| CN | 105336639 A | 2/2016 |

* cited by examiner

*Primary Examiner* — Kretelia Graham
*Assistant Examiner* — David J Goodwin
(74) *Attorney, Agent, or Firm* — Syncoda LLC; Feng Ma

(57) ABSTRACT

A test structure includes a plurality of word lines and a plurality of bit lines. A vertical gate-all-around (VGAA) transistor is formed at the intersection of each word line and each bit line. The test structure includes a first area and a second area. The second area is arranged outside the first area, the word lines in the first area and the word lines in the second area are disconnected, and the bit lines in the first area and the bit lines in the second area are disconnected. The plurality of VGAA transistors located in the first area form a test array, and a VGAA transistor located in the middle of the test array is a device to be tested.

5 Claims, 16 Drawing Sheets

Word line direction

Word line

Bit line

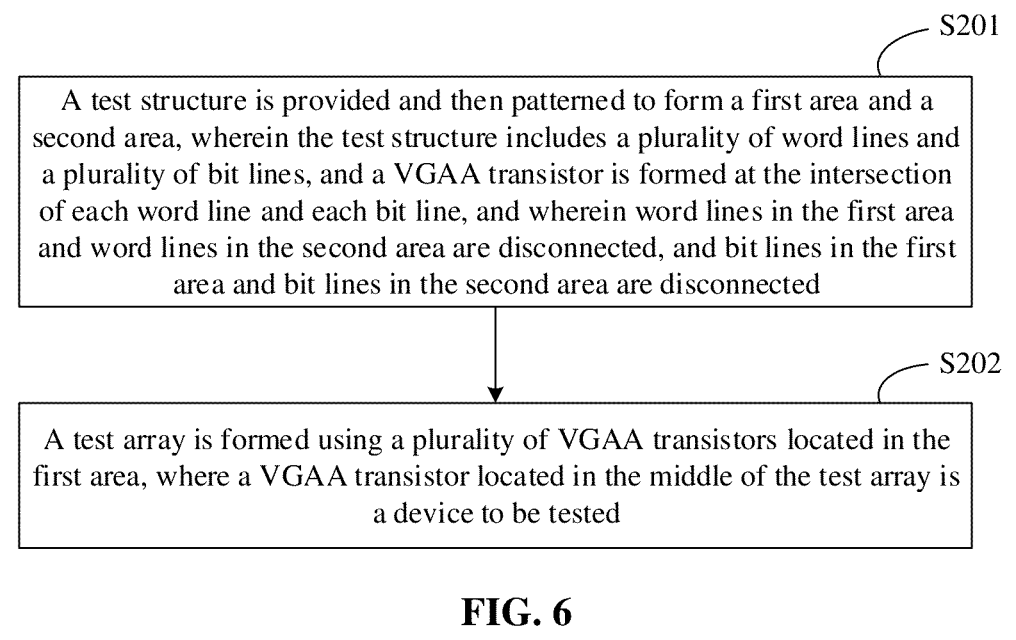

S201

A test structure is provided and then patterned to form a first area and a second area, wherein the test structure includes a plurality of word lines and a plurality of bit lines, and a VGAA transistor is formed at the intersection of each word line and each bit line, and wherein word lines in the first area and word lines in the second area are disconnected, and bit lines in the first area and bit lines in the second area are disconnected

S202

A test array is formed using a plurality of VGAA transistors located in the first area, where a VGAA transistor located in the middle of the test array is a device to be tested

FIG. 6

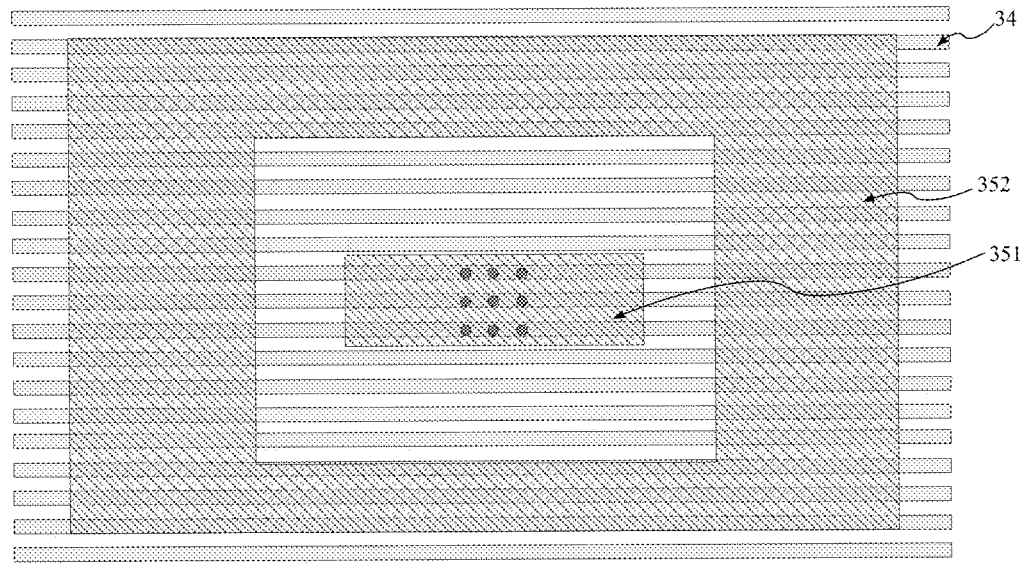
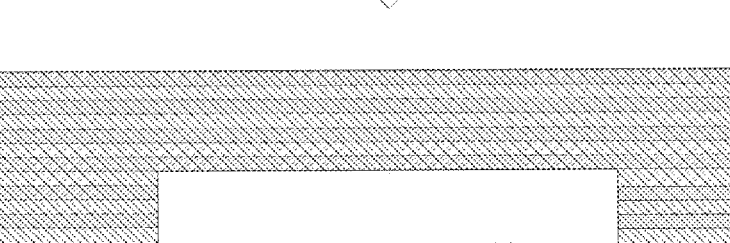
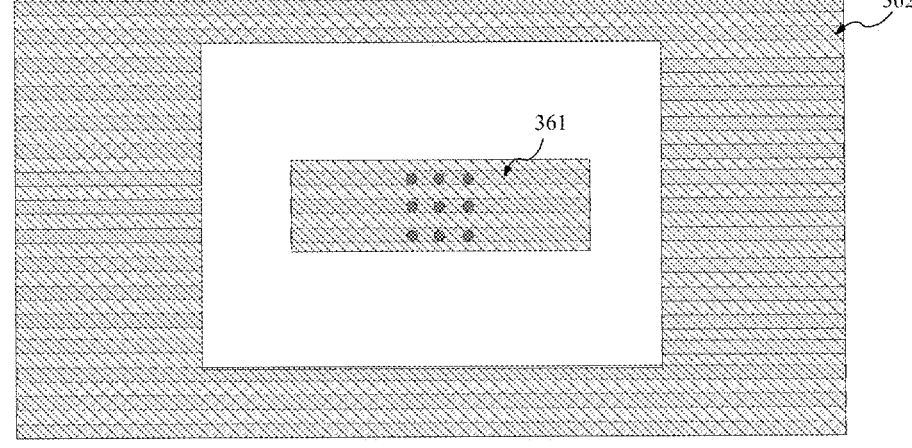
FIG. 7B

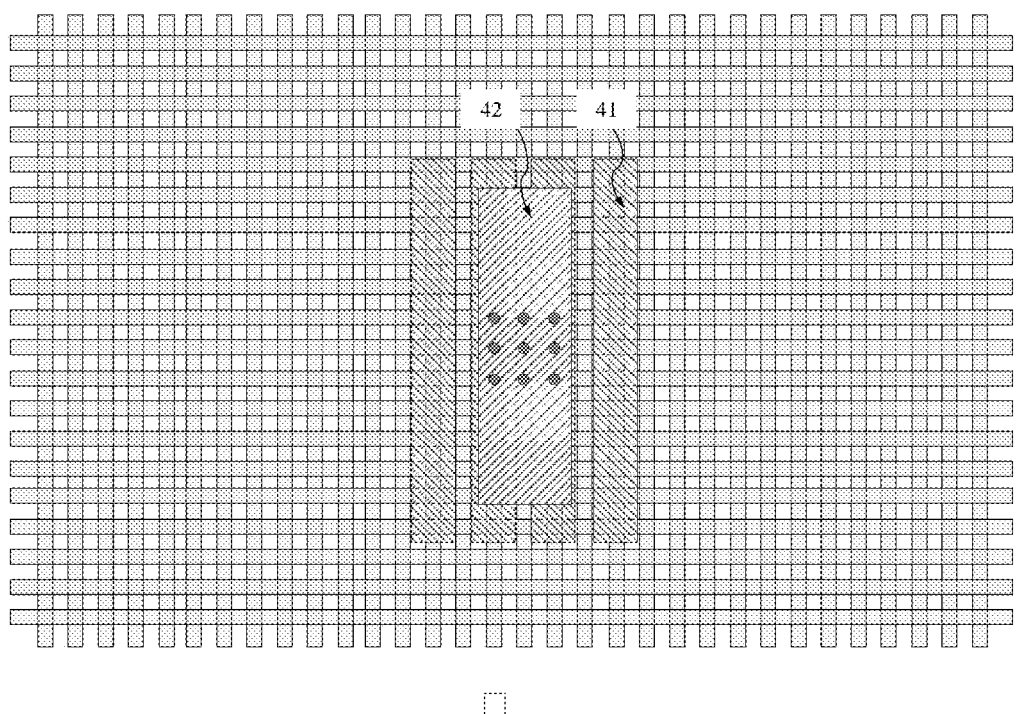
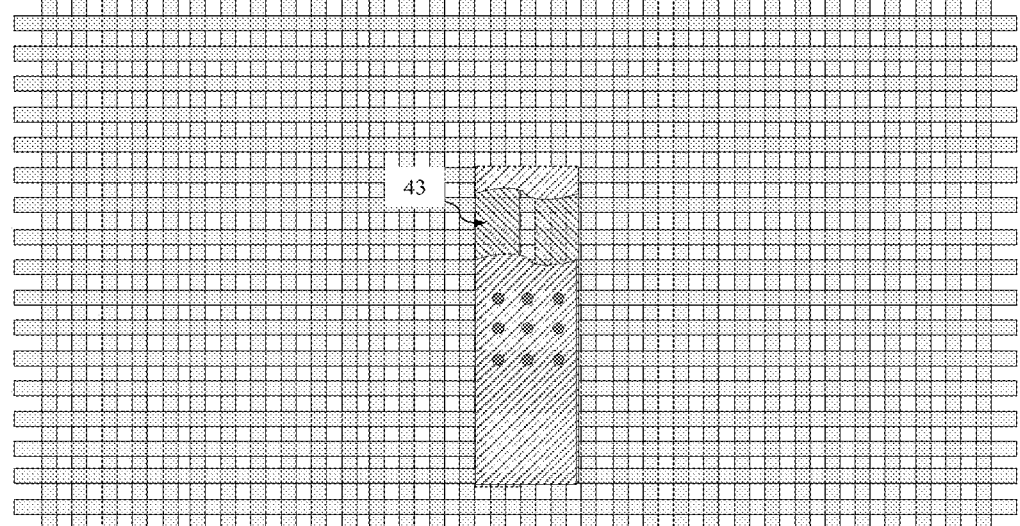
FIG. 7D

TEST STRUCTURE AND METHOD FOR FORMING THE SAME, AND SEMICONDUCTOR MEMORY

CROSS-REFERENCE TO RELATED APPLICATIONS

This is a continuation of International Patent Application No. PCT/CN2022/109733 filed on Aug. 2, 2022, which claims priority to Chinese Patent Application No. 202210844886.2 filed on Jun. 23, 2022. The disclosures of the above-referenced applications are hereby incorporated by reference in their entirety.

BACKGROUND

A Vertical gate-all-around (VGAA) transistor has more advantages in the aspects of scalability, high performance and low power consumption and is considered as the key core technology of a next-generation integrated circuit. However, the performance of the VGAA transistor is more affected by the resistance of bit line and word line. Therefore, when the VGAA transistor is tested, it is necessary to eliminate the influence of the resistance of bit line and the word line as much as possible, and to focus well on the performance of the VGAA transistor itself.

SUMMARY

The present disclosure relates to, but is not limited to, a test structure and a method for forming the same, and a semiconductor memory. The technical solutions of the present disclosure are implemented as follows.

In a first aspect, embodiments of the present disclosure provide a test structure. The test structure may include a plurality of word lines and a plurality of bit lines. A VGAA transistor is formed at an intersection of each word line and each bit line. The test structure may include a first area and a second area. The second area is arranged outside the first area, the word lines in the first area and the word lines in the second area are disconnected, and the bit lines in the first area and the bit lines in the second area are disconnected. The plurality of VGAA transistors located in the first area together form a test array, and a VGAA transistor located in the middle of the test array is a device to be tested.

In a second aspect, the embodiments of the present disclosure provide a method for forming a test structure. The method may include the following operations.

A test structure is provided, and the test structure is patterned to form a first area and a second area. Herein, the test structure may include a plurality of word lines and a plurality of bit lines, and a VGAA transistor is formed at the intersection of each word line and each bit line. The word lines in the first area and the word lines in the second area are disconnected, and the bit lines in the first area and the bit lines in the second area are disconnected. A test array is formed using a plurality of VGAA transistors located in the first area, and a VGAA transistor located in the middle of the test array is a device to be tested.

In a third aspect, the embodiments of the present disclosure provide a semiconductor memory, which may include the test structure as described in the first aspect.

BRIEF DESCRIPTION OF THE DRAWINGS

FIG. 6 is a schematic diagram of a method for forming a test structure according to embodiments of the present disclosure.

FIG. 7B is a second schematic diagram of a process of forming a test structure according to embodiments of the present disclosure.

FIG. 7D is a fourth schematic diagram of a process of forming a test structure according to embodiments of the present disclosure.

DETAILED DESCRIPTION

Figure 1A:
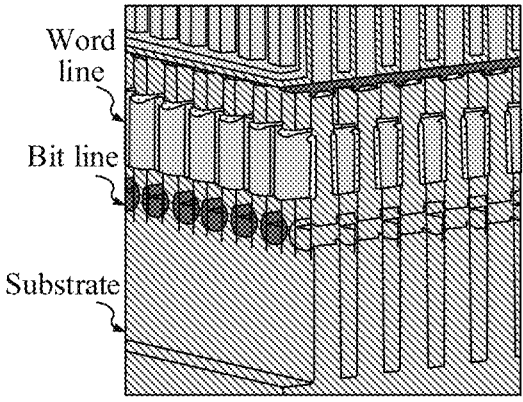
FIG. 1A is a schematic diagram of a partial three-dimensional structure of a VGAA transistor.

The technical solutions in embodiments of the present disclosure will be clearly and completely described in conjunction with the drawings in the embodiments of the present disclosure. It should be understood that the specific embodiments described herein are only used to illustrate the related application, but are not intended to limit the disclosure. In addition, it is to be noted that, for the convenience of description, only the parts related to the related application are shown in the drawings. Unless otherwise defined, all technical and scientific terms used herein have the same meaning as commonly understood by those skilled in the art of the present disclosure. The terms used herein are only for the purpose of describing the embodiments of the present disclosure and are not intended to limit the present disclosure and are not intended to limit the present disclosure. In the following description, reference is made to "some embodiments" which describe a subset of all possible embodiments, but it should be understood that "some embodiments" may be the same or different subsets of all possible embodiments, and may be combined with each other without conflict. It is to be noted that the terms "first/second/third" involved in the embodiments of the present disclosure are only used to distinguish similar objects, and do not represent a specific order of the objects. It should be understood that the specific order or sequence of "first/second/third" may be interchangeable under the allowable circumstances, so that the embodiments of the disclosure described herein may be implemented in an order other than those illustrated or described herein.

Figure 1B:
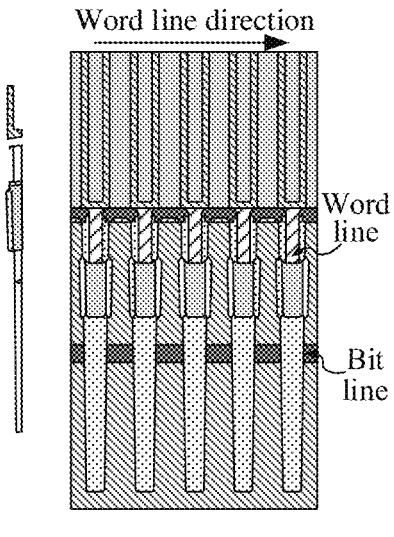
FIG. 1B is a cross-sectional view of a VGAA transistor in a word line direction.
Figure 1C:
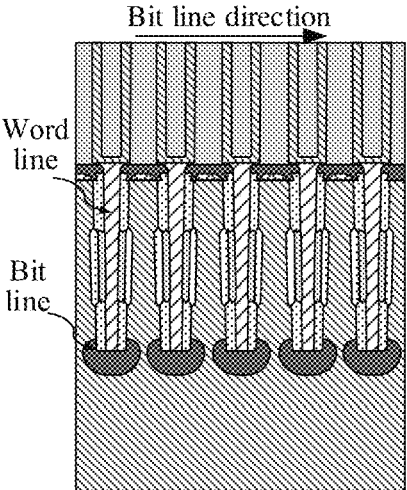
FIG. 1C is a cross-sectional view of a VGAA transistor in a bit line direction.

FIG. 1A to FIG. 1C show a schematic structural diagram of a vertical gate-all-around (VGAA) transistor, and the VGAA transistor may be specifically referred to as a vertical gate-all-around junctionless N-type transistor. In the smallest device structure 4F2, the channel diameter of the transistor is only 15 nanometers. Specifically, FIG. 1A is a schematic diagram of a partial three-dimensional structure of a VGAA transistor, FIG. 1B is a cross-sectional view of a VGAA transistor in a word line direction, and FIG. 1C is a cross-sectional view of a VGAA transistor in a bit line direction. As shown in FIGS. 1A to 1C, a buried bit line and a self aligned isolated bit line are used in the VGAA transistor. For a VGAA transistor, a channel extends vertically on the substrate, and a gate completely surrounds the portion of a channel region located on the substrate, which may effectively reduce the size of the transistor.

Figure 2:
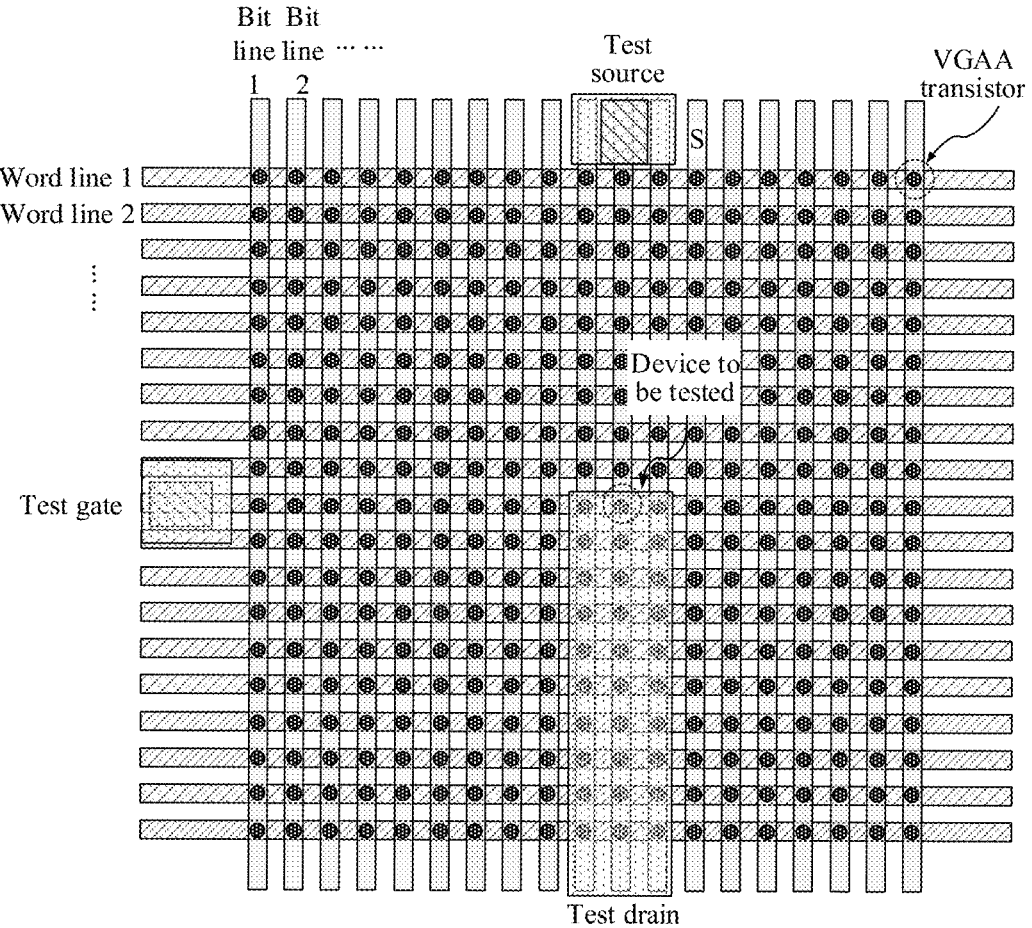
FIG. 2 is a schematic diagram of a test structure.

A test structure may be arranged in a semiconductor memory, and the test structure is the same as the structure of the memory array, but is specially configured for a test process. For the test structure, a test endpoint needs to be drawn from the corresponding position of a word line and the corresponding position of a bit line, so as to realize the performance detection of the transistor. FIG. 2 shows a schematic diagram of a test structure. As shown in FIG. 2, the test structure consists of a plurality of word lines and a plurality of bit lines, and a VGAA transistor is formed at the intersection of each bit line and each word line. Since the performance of the VGAA transistor in the middle area is better and the most representative, the VGAA transistor in the middle area is generally selected as a device to be tested. For the device to be tested, a test gate needs to be drawn from the word line at the edge, a test source (connected with a current source) needs to be drawn from the bit line at the edge, and the current situation under different operating conditions are obtained from a drain of the device to be tested, so as to understand the performance of the device to be tested.

Figure 3:
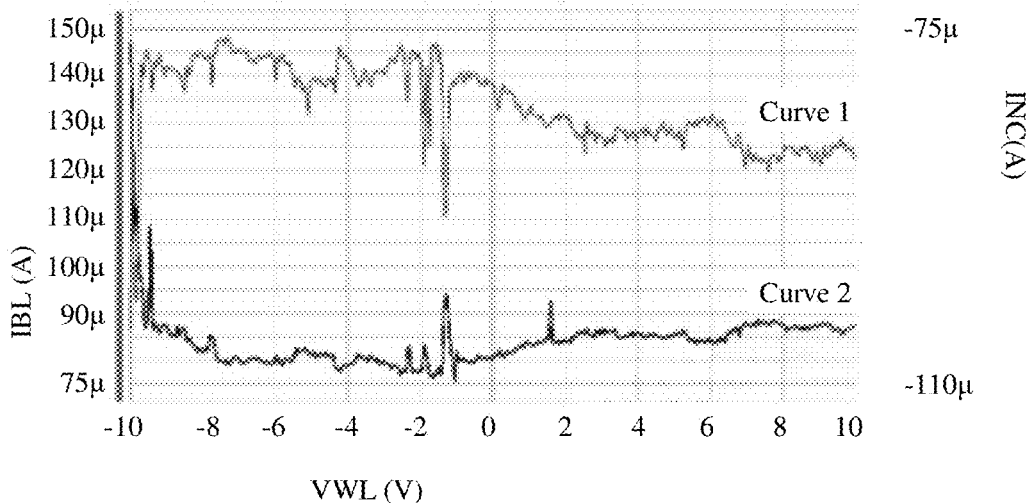
FIG. 3 is a schematic diagram of an abnormal test result of a VGAA transistor.

However, the VGAA transistor is more affected by the high resistance of the bit line and word line due to the structure thereof. FIG. 3 shows a schematic diagram of an abnormal test result of a VGAA transistor. In FIG. 3, a horizontal axis (X-axis) refers to word line voltage (VWL), a vertical axis (Y-axis) refers to bit line current (IBL)/ transistor current (INC), the unit of the voltage is volt (V), the unit of the current is microamp (μA), a curve 1 is used to indicate the change of the transistor current (i.e., the real current of the device) with the word line current, and a curve 2 is used to indicate the change of the bit line current (i.e., the current obtained from the test result) with the word line voltage. As shown in FIG. 3, the curve 1 and the curve 2 are not completely corresponding. That is, in the process of testing the VGAA transistor, the high resistance of the bit line/word line may affect the final test result, so that the test result may not accurately characterize the actual performance of the VGAA transistor.

Based on this, the embodiments of the disclosure provide a test structure. The test structure includes a plurality of word lines and a plurality of bit lines. A VGAA transistor is formed at the intersection of each word line and each bit line. The test structure includes a first area and a second area. The second area is arranged outside the first area, the word line in the first area and the word line in the second area are disconnected, and the bit line in the first area and the bit line in the second area are disconnected. The plurality of VGAA transistors located in the first area together form a test array, and the VGAA transistor located in the middle of the test array is a device to be tested. In this way, the small-sized test array is formed using the VGAA transistors in the first area, so that the influence of the high resistance of the word line and bit line on the test result is reduced, and thus the test result may more accurately characterize the performance of the device to be tested.

The embodiments of the present disclosure will be described in detail below with reference to the accompanying drawings.

Figure 4:
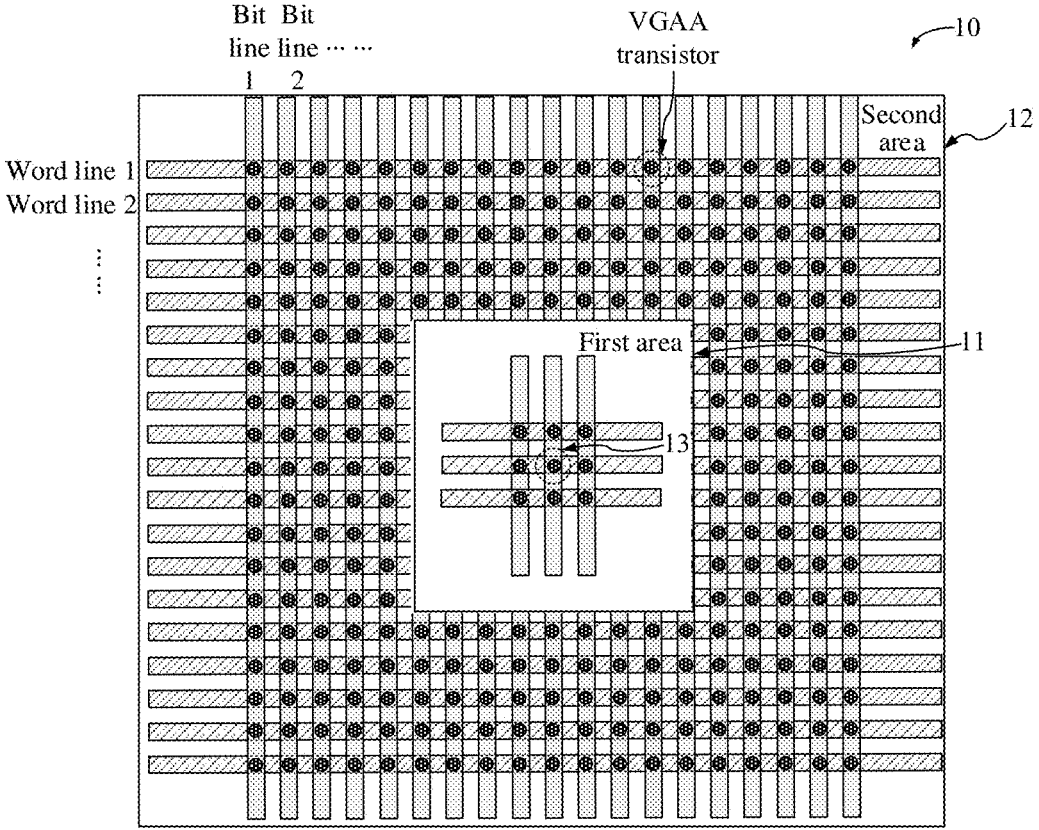
FIG. 4 is a schematic diagram of a test structure according to embodiments of the present disclosure.

In an embodiment of the present disclosure, FIG. 4 shows a schematic diagram of a test structure 10 according to embodiments of the present disclosure. As shown in FIG. 4, the test structure 10 includes a plurality of word lines (such as a word line 1, a word line 2, etc. in FIG. 4) and a plurality of bit lines (such as a bit line 1, a bit line 2, etc. in FIG. 4), and a VGAA transistor (only one VGAA transistor is marked in FIG. 4) is formed at the intersection of each word line and each bit line. The test structure 10 includes a first area 11 and a second area 12. The second area is arranged outside the first area 11, the word lines in the first area 11 and the word lines in the second area 12 are disconnected, and the bit lines in the first area 11 and the bit lines in the second area 12 are disconnected. The plurality of VGAA transistors located in the first area 11 together form a test array, and the VGAA transistor 13 located in the middle of the test array is a device to be tested.

It is to be noted that, the test structure provided by the embodiments of the present disclosure is applied to a semiconductor memory, and the test structure may also be called a Testkey. The performance of the related device may be known by testing the test structure.

In the embodiments of the present disclosure, the test structure 10 is divided into two independent areas, i.e., the first area 11 and the second area 12. A small-sized test array may be formed using the VGAA transistors in the first area 11, and the device to be tested may be connected with a corresponding test endpoint through the shorter word line and bit line, which reduces the influence of high resistance of the word line and bit line on the test result, so that the test result may better characterize the performance of the device to be tested, and thus the accuracy of the test result is improved.

Herein, the specific position between the first area 11 and the second area 12 may be determined according to the actual application scenario. In FIG. 4, the outer edge of the first area 11 forms the inner edge of the second area 12, that is, the second area 12 surrounds the outside of the first area 11, but this does not constitute a relevant limitation. In another embodiment, the first area 11 may occupy a corner of the test structure 10, and at this time the second area 12 does not completely surround the first area 11. In yet another embodiment, the first area 11 and the second area 12 are arranged side by side, etc.

It is to be noted that, the size of the test array in the first area 11 may be determined according to the actual application scenario, and FIG. 4 shows a test array being a (3×3) array. However, the test array may also be a (5×5) array, a (4×5) array, a (5×9) array, a (16×16) array, etc. That is, the size of the test array is an (m×n) array, where m and n are both positive integers, and m and n are equal or unequal. Herein, the values of m and n include at least any one of the following: 3, 4, 5, 9, or 16.

Figure 5:
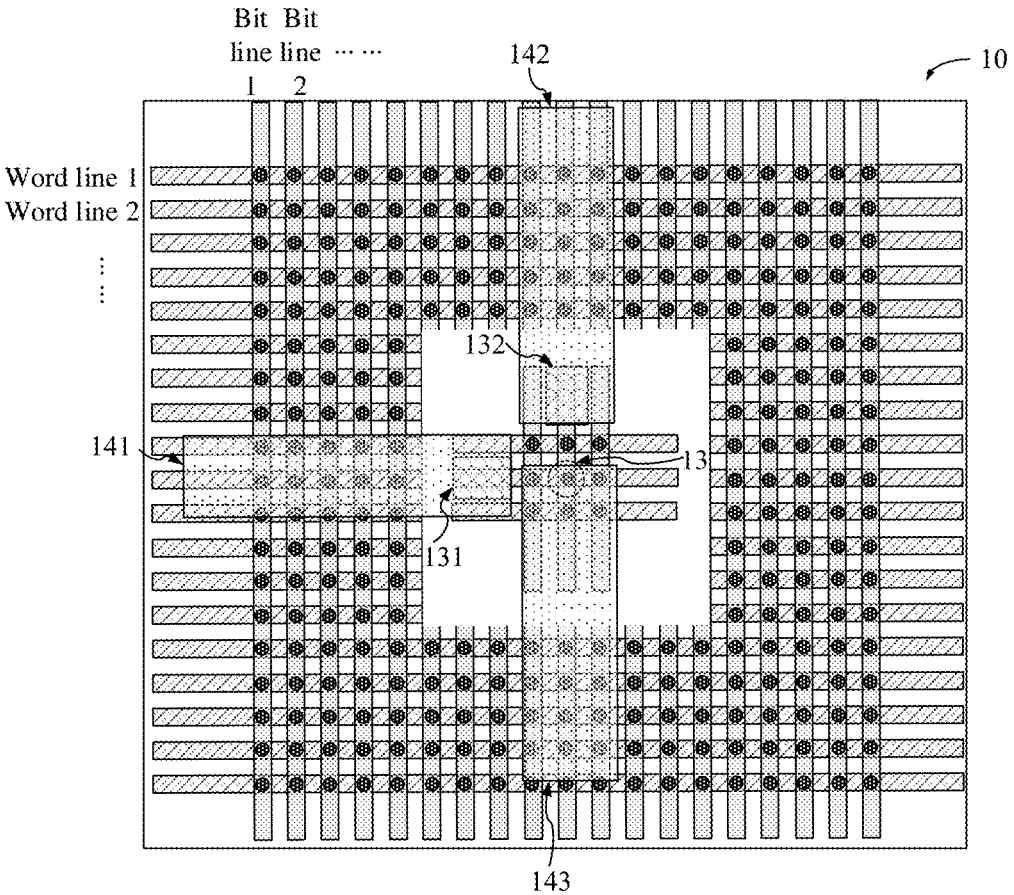
FIG. 5 is a schematic diagram of another test structure according to embodiments of the present disclosure.

In some embodiments, as shown in FIG. 5, the test structure 10 further includes a gate contact node 131 and a source contact node 132. The gate contact node 131 is located in the first area, and the gate contact node 131 is connected with the control end of the device to be tested 13 through a word line. The source contact node 132 is located in the first area, and the source contact node 132 is connected with the first end of the device to be tested 13 through a bit line.

In some embodiments, as shown in FIG. 5, the test structure 10 further includes a first metal layer 141, a second metal layer 142, and a third metal layer 143. The first metal layer 141 is connected with the gate contact node 131 in a covered manner, and the first metal layer 141 extends to the outside of the second area 12. The second metal layer 142 is connected with the source contact node 132 in a covered manner, and the second metal layer 142 extends to the outside of the second area 12. The third metal layer 143 is connected with the second end of the device to be tested 13, and the third metal layer 143 extends to the outside of the second area 12.

It is to be noted that, the respective extension directions of the first metal layer 141, the second metal layer 142, and the third metal layer 143 to the second area 12 are different. Exemplarily, as shown in FIG. 5, the first metal layer 141 extends to the second area 12 in the word line direction, the second metal layer 142 extends upward to the second area 12 in the bit line direction, and the third metal layer 143 extends downwards to the second area 12 in the bit line direction. But this does not constitute a limitation. The first metal layer 141, the second metal layer 142 and the third metal layer 143 may extend to the second area 12 in any direction as long as they do not intersect with each other.

It is to be noted that, the first metal layer 141 is configured to connect a gate of the device to be tested, the second metal layer 142 is configured to connect a source of the device to be tested, and the third metal layer 143 is configured to connect a drain of the device to be tested.

In some embodiments, as shown in FIG. 5, the width of the first metal layer 141 in the bit line direction covers three word lines, and the first metal layer 141 does not cover the test array. The width of the second metal layer 142 in the word line direction covers three bit lines, and the second metal layer 142 does not cover the test array. In addition, the width of the third metal layer 143 in the word line direction covers three bit lines, the third metal layer 143 covers the i-th row to the m-th row in the test array, and i refers to the row where the device to be tested is located.

The embodiments of the present disclosure provide a test structure. The test structure includes a plurality of word lines and a plurality of bit lines. A VGAA transistor is formed at the intersection of each word line and each bit line. The test structure includes the first area and the second area. The second area is arranged outside the first area, the word lines in the first area and the word lines in the second area are disconnected, and the bit lines in the first area and the bit lines in the second area are disconnected. A plurality of VGAA transistors located in the first area together form a test array, and a VGAA transistor located in the middle of the test array is a device to be tested. In this way, a small array of Testkeys are formed using the first area, and the device to be tested may be connected with the metal layer (of the test endpoint) through the shorter word line and bit line, which reduces the influence of the high resistance of the word line and bit line on the test result, so that the test result can well focus on the performance of the device to be tested, and thus the accuracy of the test result is improved.

In another embodiment of the present disclosure, FIG. 6 shows a flowchart of a method for forming a test structure

10 according to embodiments of the present disclosure. As shown in FIG. 6, the method may include the following operations.

At S201, a test structure is provided, and the test structure is patterned to form a first area and a second area. Herein, the test structure includes a plurality of word lines and a plurality of bit lines, and a VGAA transistor is formed at the intersection of each word line and each bit line. The word lines in the first area and the word lines in the second area are disconnected, and the bit lines in the first area and the bit lines in the second area are disconnected.

It is to be noted that the forming method provided by the embodiment of the present disclosure is used to form a small array of Testkeys, i.e., the above test structure 10.

At S202, a test array is formed using a plurality of VGAA transistors located in the first area, and a VGAA transistor located in the middle of the test array is a device to be tested.

In this way, through the patterning processing, the test structure is divided into the first area and the second area, and then the small-sized test array is formed using the VGAA transistors in the first area, so that the device to be tested may be connected with a corresponding test endpoint through the shorter word line/bit line, which reduces the influence of high resistance of the word line and bit line on the test result, so that the test result can well focus on the performance of the device to be tested, and the accuracy of the test result is thereby improved.

Taking the second area surrounding the first area as an example, FIGS. 7A to 7F show a schematic diagram of a process of forming a test structure according to embodiments of the present disclosure. The specific process of forming the test structure will be described below with reference to FIGS. 7A to 7F.

It is to be noted that, for the test structure, the bit line is located at the lower layer of the word line. Therefore, during the process of patterning processing, the bit line is formed first, and then the word line is formed.

Therefore, in some embodiments, the operation of patterning the test structure to form a first area and a second area may include the following operations.

A target bit line pattern is formed, and the target bit line pattern is transferred to a bit line layer in the test structure. Herein, the target bit line pattern includes a first bit line pattern located in the first area and a second bit line pattern located in the second area. A plurality of bit lines are formed based on the first bit line pattern and the second bit line pattern. A target word line pattern is formed, and the target word line pattern is transferred to a word line layer of the test structure. Herein, the target word line pattern includes a first word line pattern located in the first area and a second word line pattern located in the second area. A plurality of word lines are formed based on the first word line pattern and the second word line pattern.

Figure 7A:
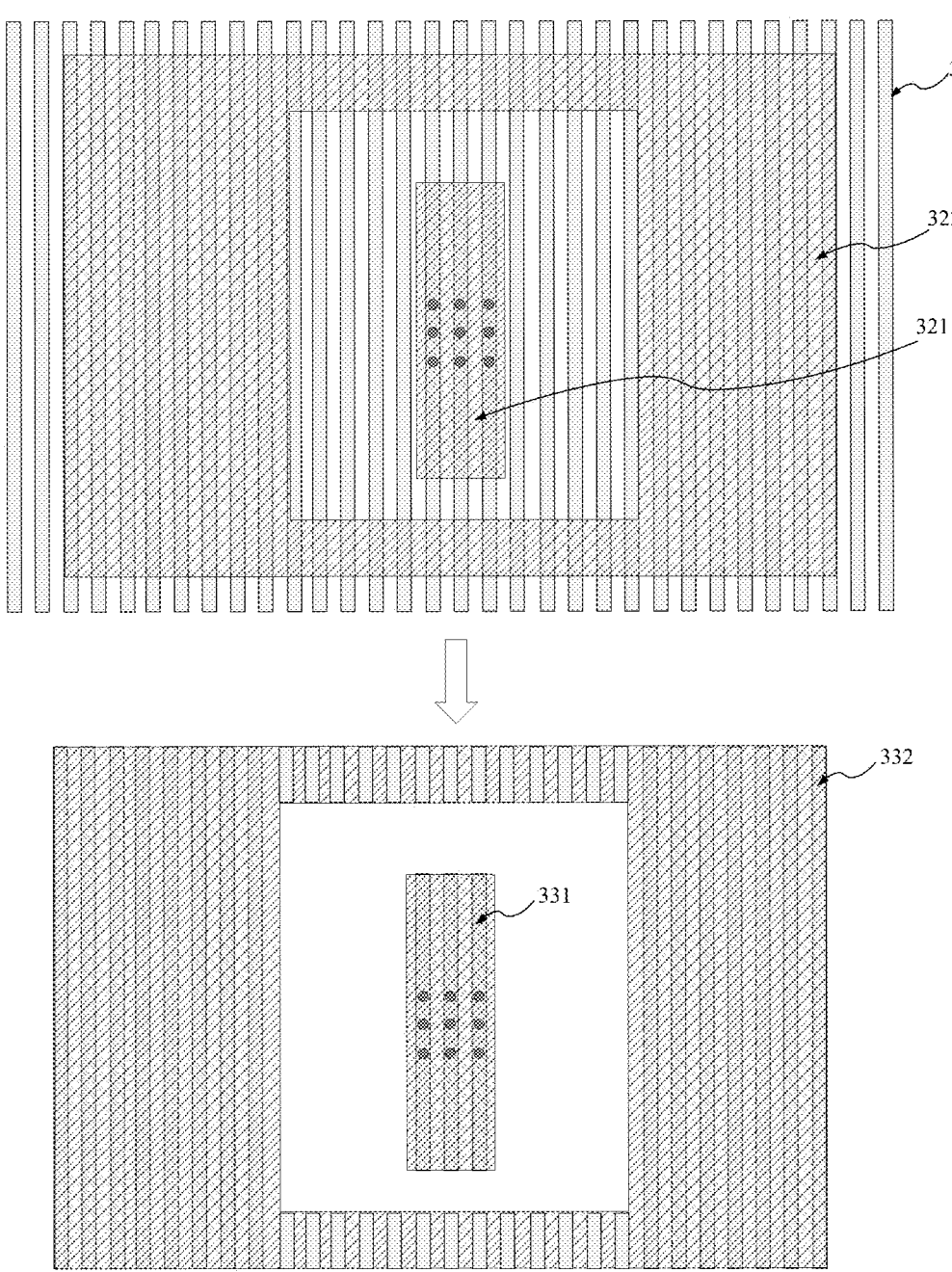
FIG. 7A is a first schematic diagram of a process of forming a test structure according to embodiments of the present disclosure.

In a specific embodiment, FIG. 7A specifically shows the process of forming the target bit line pattern. The operation of forming a target bit line pattern includes the following operations.

A plurality of bit line patterns 31 (only one bit line pattern is numbered in FIG. 7A) are formed on the test structure. A first mask pattern 321 is formed in the first area, and a second mask pattern 322 is formed in the second area. Herein, the first mask pattern 321 and the second mask pattern 322 are disconnected. The first mask pattern 321 covers the test array and extends out a part in the bit line direction.

The plurality of bit line patterns 31 are trimmed based on the first mask pattern 321 and the second mask pattern 322 to obtain the first bit line pattern 331 and the second bit line pattern 332.

It is to be noted that, firstly, the plurality of bit line patterns 31 are printed on the test structure as a whole by means of lithographic development, and then the plurality of bit line patterns 31 are trimmed, and only the bit line patterns (that is, the first bit line pattern 331) covered with the first mask pattern 321 and the bit line patterns (that is, the second bit line pattern 332) covered with the second mask pattern 322 are reserved. In this way, the plurality of bit lines are formed on the bit line layer of the test structure according to the first bit line pattern 331 and the second bit line pattern 332. Here, the first bit line pattern 331 and the second bit line pattern 332 are disconnected and are independent from each other.

In a specific embodiment, FIG. 7B specifically shows the process of forming the target bit line pattern. The operation of forming a target word line pattern may include the following operations.

A plurality of word line patterns 34 (only one word line pattern is numbered in FIG. 7B) are formed on the test structure. A third mask pattern 351 is formed in the first area, and a fourth mask pattern 352 is formed in the second area. Herein, the third mask pattern 351 and the fourth mask pattern 352 are disconnected, the third mask pattern 351 covers the test array and extends out a part in the word line direction.

The plurality of word line patterns 34 are trimmed based on the third mask pattern 351 and the fourth mask pattern 352 to obtain a first word line pattern 361 and a second word line pattern 362.

It is to be noted that, firstly, the plurality of word line patterns 34 are printed on the test structure as a whole by means of lithographic development, and then the plurality of word line patterns 34 are trimmed, and only the word line pattern (that is, the first word line pattern 361) covered with the third mask pattern 351 and the word line pattern (that is, the second word line pattern 362) covered with the fourth mask pattern 352 are reserved. In this way, the plurality of word lines are formed at the corresponding word line layer according to the first word line pattern 361 and the second word line pattern 362. Here, the first word line pattern 361 and the second word line pattern 362 are disconnected and are independent from each other.

Figure 7C:
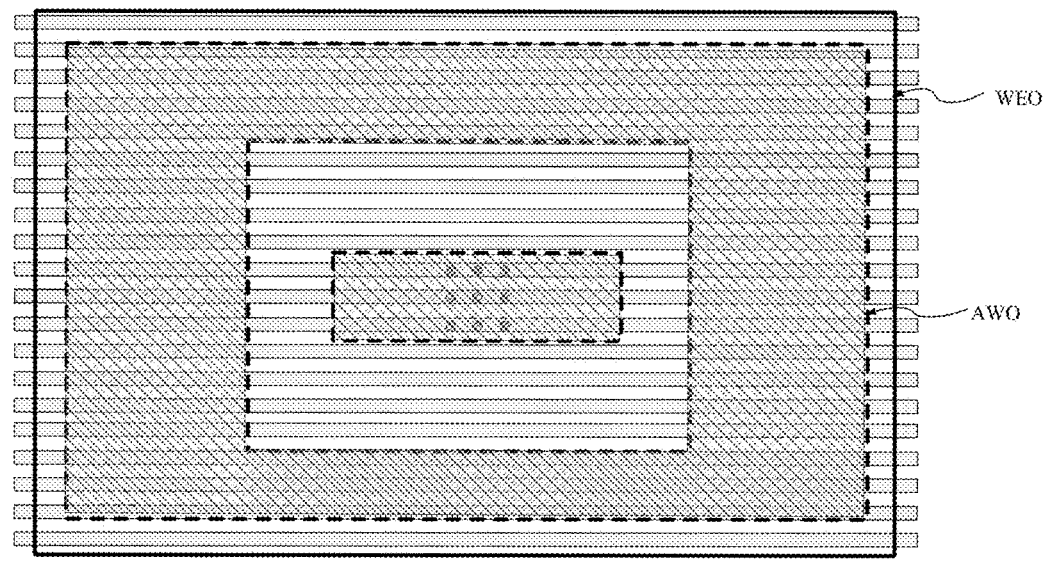
FIG. 7C is a third schematic diagram of a process of forming a test structure according to embodiments of the present disclosure.

In another embodiment, a word line opening is also involved in the process of forming the word lines, so as to realize the segmentation of the test structure and the segmentation of the test array. FIG. 7C shows a schematic diagram of a location of a word line opening. As shown in FIG. 7C, the method further includes that: a Word Line Etch Opening (WEO) pattern is formed to define a word line opening area; and an Array Word Line Opening (AWO) is formed to define a metal formation area of the word line. That is, in the process of trimming the word line, the WEO is trimmed first to realize the segmentation of the test structure and other external structures, and then the AWO is trimmed to realize the segmentation of the first area and the second area (test array).

It should be understood that the detailed word line formation process and the bit line formation process are relatively mature, and are not repeated in the embodiments of the present disclosure.

After the word line and bit line are formed, a third metal layer is formed in the test structure to draw out the drain of the device to be tested.

In some embodiments, the operation of forming a test array using the plurality of VGAA transistors in the first area includes the following operations.

A first target contact pattern is formed in the first area, the test structure is etched based on the first target contact pattern, and the drain of the device to be tested is exposed in the bit line direction. A second target contact pattern is formed in the first area, the test structure is etched based on the second target contact pattern, and the drain of the device to be tested is exposed in the word line direction. The drain of the device to be tested is covered to form the third metal layer.

In a specific embodiment, FIG. 7D specifically shows the process of forming a target bit line pattern. The operation of forming the first target contact pattern 43 in the first area includes the following operations.

A plurality of first contact patterns 41 (only one first contact pattern is numbered in FIG. 7D) arranged in the word line direction are formed in the first area. A fifth mask pattern 42 is formed. Herein, the fifth mask pattern 42 covers the test array and extends to both sides in the bit line direction. The plurality of first contact patterns 41 are trimmed based on the fifth mask pattern 42 to obtain the first target contact pattern 43.

Figure 7E:
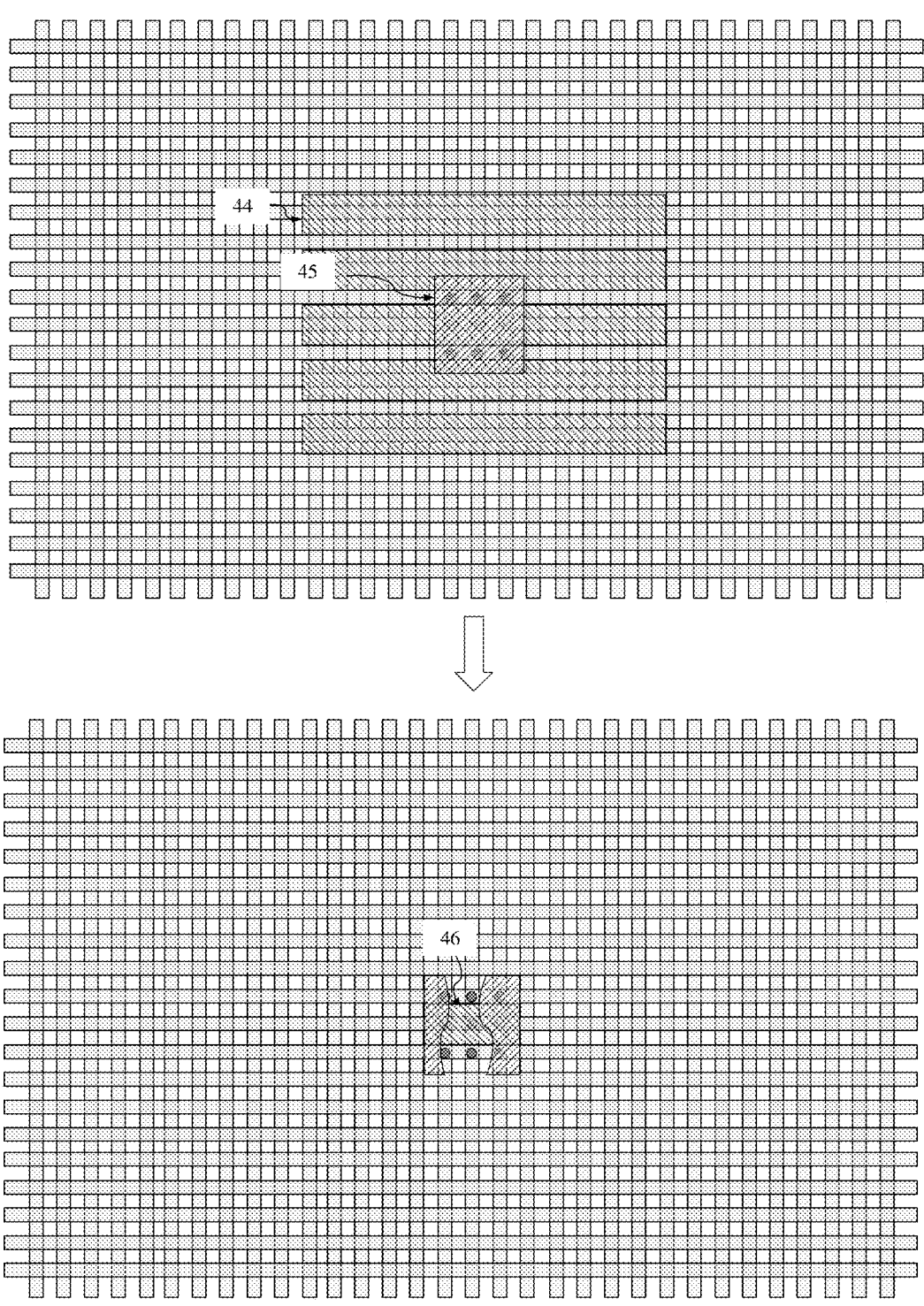
FIG. 7E is a fifth schematic diagram of a process of forming a test structure according to embodiments of the present disclosure.

In some embodiments, as shown in FIG. 7E, the operation of forming the second target contact pattern 46 in the first area includes the following operations.

A plurality of second contact patterns 44 (only one second contact pattern is numbered in FIG. 7E) arranged in the bit line direction are formed in the first area. A sixth mask pattern 45 is formed. Herein, the sixth mask pattern 45 covers the test array. The plurality of second contact patterns 41 are trimmed based on the sixth mask pattern 45 to obtain the second target contact pattern 46.

In this way, the drain at the top of the device to be tested is exposed by exposure etching in two directions (i.e., the word line direction and the bit line direction), thereby forming the third metal layer.

After the first metal layer is formed, the first metal layer and the second metal layer also need to be formed to draw out the gate and the source of the device to be tested. Therefore, FIG. 7F and FIG. 7G specifically show the process of forming the first metal layer and the second metal layer. The operation of forming the test array using the plurality of VGAA transistors in the first area further includes the following operations.

The test structure is etched to expose the gate contact node 131. The first metal layer 141 is formed on the gate contact node 131 in a covering manner. Herein, the gate contact node 131 is connected with the gate of the device to be tested through the word line.

The test structure is etched to expose the source contact node 132. The second metal layer 142 is formed on the source contact node 132 in a covering manner. Herein, the source contact node 132 is connected with the source of the device to be tested through the bit line.

It is to be noted that, the first metal layer 141, the second metal layer 142, and the third metal layer 143 all extend from the first area to the second area, and the respective extension directions of the first metal layer 141, the second metal layer 142 and the third metal layer 143 to the second area are different. The first metal layer 141, the second metal layer 143 and the third metal layer do not intersect with each other. In addition, the forming order of the first metal layer 141 and the second metal layer 142 needs to be determined according to the actual process scenario.

In this way, the first metal layer 141 is configured to connect the gate of the device to be tested, the second metal layer 142 is configured to connect the source of the device to be tested, and the third metal layer 143 is configured to connect the drain of the device to be tested, so as to test the device to be tested.

Figure 7F:
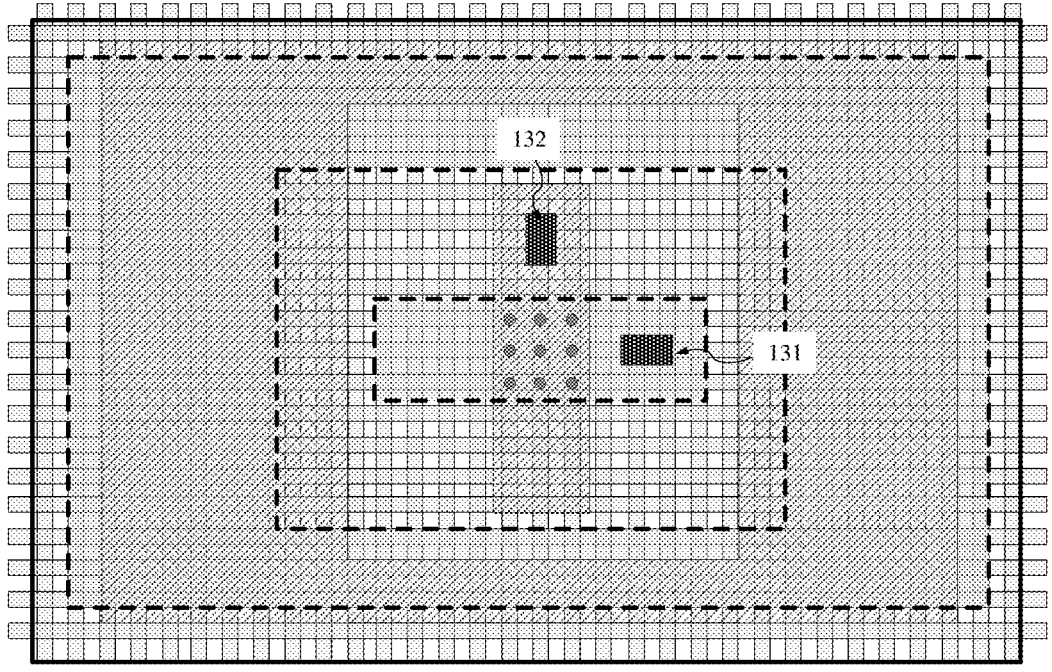
FIG. 7F is a sixth schematic diagram of a process of forming a test structure according to embodiments of the present disclosure.
Figure 7G:
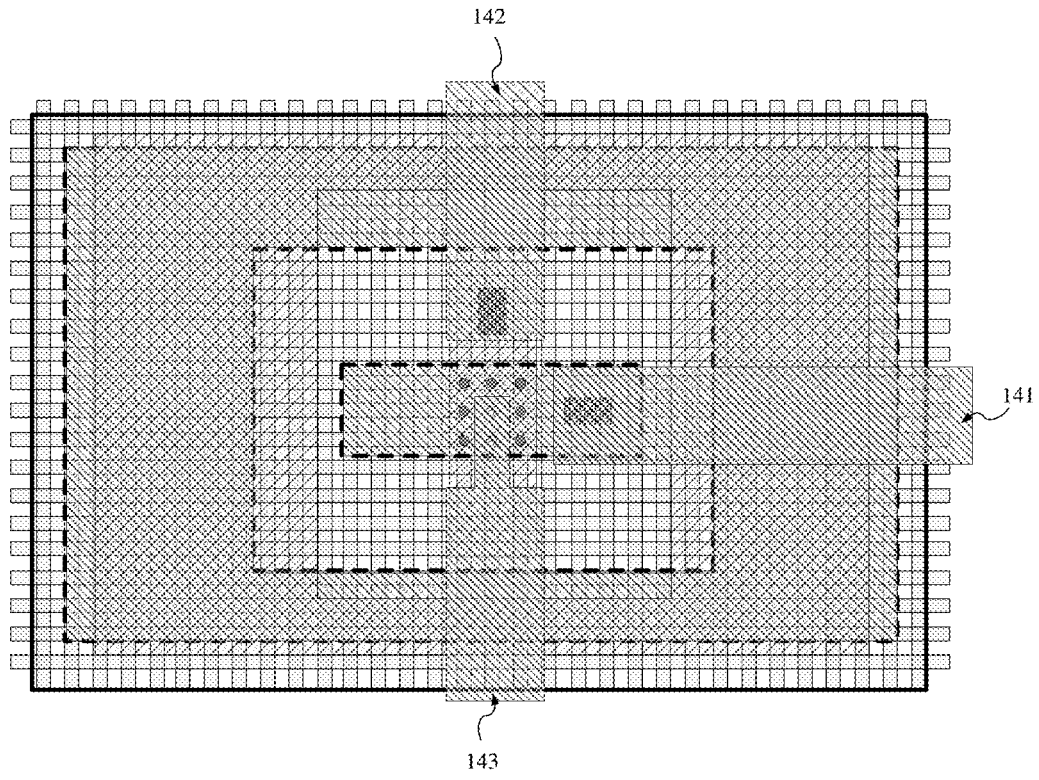
FIG. 7G is a seventh schematic diagram of a process of forming a test structure according to embodiments of the present disclosure.

It should be understood that, in FIG. 7F to FIG. 7G, the above various mask patterns, word line patterns, bit line patterns, contact patterns, etc. are all reserved, just for testing the positions of different patterns/elements in the structure as a whole. In addition, the sizes and shapes of various patterns in FIG. 7A to FIG. 7G may be adjusted according to the actual application scenario, and the embodiments of the present disclosure are only for illustration and not for specific limitation.

The embodiments of the present disclosure provide a method for forming a test structure. The method includes that: a test structure is provided, and the test structure is patterned to form a first area and a second area. Herein, the test structure includes a plurality of word lines and a plurality of bit lines, and a VGAA transistor is formed at the intersection of each word line and each bit line. The word lines in the first area and the word lines in the second area are disconnected, and the bit lines in the first area and the bit lines in the second area are disconnected. A test array is formed using a plurality of VGAA transistors located in the first area, and a VGAA transistor located in the middle of the test array is a device to be tested. In this way, a small-sized test array (or called Testkey) may be formed using the VGAA transistors in the first area, and the device to be tested may be connected with the metal layer (of the test endpoint) through the shorter word line and bit line, which improves the influence of high word line resistance and bit line resistance on the test result, so that the test result can well focus on the performance of the device to be tested, and the accuracy of the test result is improved.

Figure 8:
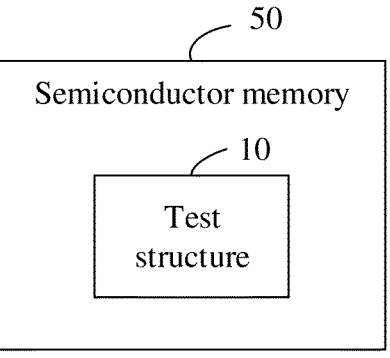
FIG. 8 is an eighth schematic structural diagram of compositions of a semiconductor memory according to embodiments of the present disclosure.

In yet another embodiment of the present disclosure, FIG. 8 shows a schematic structural diagram of a semiconductor memory 50 according to embodiments of the present disclosure. As shown in FIG. 8, the semiconductor memory 50 may include the test structure 10 as described in any of the foregoing embodiments.

In this way, for the semiconductor memory 50, the device to be tested (VGAA transistor) in the test structure may be connected with the metal layer (of the test endpoint) through the shorter word line and bit line, so that the influence of high word line resistance and bit line resistance on the test result is improved, and the test result can be well focused on the performance of the device to be tested.

The above are only the preferred embodiments of the present disclosure, and are not intended to limit the scope of protection scope of the present disclosure.

It is to be noted that in this disclosure, the terms "including", "containing" or any other variation thereof are intended to cover non-exclusive inclusion, so that a process, method, article or device including a series of elements includes not only those elements, but also other elements not explicitly listed, or elements inherent to the process, method, article or device. Without more restrictions, an element defined by the sentence "including a . . . " does not exclude the existence of other identical elements in the process, method, article, or device including the element. The above numbers of the embodiments of the present disclosure are only for description, and do not represent the advantages or disadvantages of the embodiments. The methods disclosed in the several method embodiments provided in the present disclosure may be combined arbitrarily without conflict to obtain new method embodiments. The features disclosed in the several product embodiments provided in the present disclosure may be combined arbitrarily without conflict to obtain new product embodiment. The features disclosed in several method or device embodiments provided in the present disclosure may be combined arbitrarily without conflict to obtain new method embodiments or device embodiments. The above are only the specific implementation modes of the present disclosure and not intended to limit the scope of protection of the present disclosure. Any variations or replacements apparent to those skilled in the art within the technical scope disclosed by the disclosure shall fall within the scope of protection of the present disclosure.

The embodiments of the present disclosure provide a test structure. The test structure includes a plurality of word lines and a plurality of bit lines, and a VGAA transistor is formed at the intersection of each word line and each bit line. The test structure includes a first area and a second area. The second area is arranged outside the first area, the word lines in the first area and the word lines in the second area are disconnected, and the bit lines in the first area and the bit lines in the second area are disconnected. A plurality of VGAA transistors located in the first area together form a test array, and a VGAA transistor located in the middle of the test array is a device to be tested. In this way, the small-sized test array is formed using the VGAA transistors in the first area, so that the influence of high resistance of the word line and bit line on the test result is reduced, and the test result can more accurately characterize the performance of the device to be tested.

What is claimed is:

1. A test structure, comprising a plurality of word lines and a plurality of bit lines, wherein a vertical gate-all-around (VGAA) transistor is formed at an intersection of each word line and each bit line;

the test structure comprises a first area and a second area, wherein the second area is arranged outside the first area, word lines in the first area and word lines in the second area are disconnected, and bit lines in the first area and bit lines in the second area are disconnected; and a plurality of VGAA transistors located in the first area form a test array, and a VGAA transistor located in the middle of the test array is a device to be tested;

a gate contact node and a source contact node; wherein the gate contact node is located in the first area, and the gate contact node is connected with a control end of the device to be tested through a word line; and the source contact node is located in the first area, and the source contact node is connected with a first end of the device to be tested through a bit line;

a first metal layer, a second metal layer, and a third metal layer; wherein the first metal layer covers and is connected with the gate contact node, and the first metal layer extends to an outside of the second area;

the second metal layer covers and is connected with the source contact node, and the second metal layer extends to the another outside of the second area;

the third metal layer covers and is connected with a second end of the device to be tested, and the third metal layer extends to the outside of the second area;

wherein extension directions of the first metal layer, the second metal layer, and the third metal layer to the second area are different, and the first metal layer, the second metal layer and the third metal layer do not intersect with each other.

2. The test structure of claim 1, wherein the first metal layer is configured to connect a gate of the device to be tested, the second metal layer is configured to connect a source of the device to be tested, and the third metal layer is configured to connect a drain of the device to be tested.

3. The test structure of claim 1, wherein a width of the first metal layer in a bit line direction covers three word lines, and the first metal layer does not cover the test array; and a width of the second metal layer in a word line direction covers three bit lines, and the second metal layer does not cover the test array.

4. The test structure of claim 1, wherein a size of the test array is an (m×n) array, where m and n are both positive integers, and m and n are equal or unequal;

wherein values of m and n include at least any one of the following: 3, 4, 5, 9, or 16.

5. A semiconductor memory, comprising the test structure of claim 1.

* * * * *